(12) United States Patent
Hack et al.

(10) Patent No.: US 9,165,984 B2
(45) Date of Patent: Oct. 20, 2015

(54) OLEDS FOR USE IN NVIS CAPABLE DEVICES

(71) Applicant: Universal Display Corporation, Ewing, NJ (US)

(72) Inventors: Michael Hack, Princeton, NJ (US); Michael S. Weaver, Princeton, NJ (US); Vadim Adamovich, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/166,720

(22) Filed: Jan. 28, 2014

(65) Prior Publication Data

US 2015/0214281 A1    Jul. 30, 2015

(51) Int. Cl.
*H01J 1/62* (2006.01)
*H01L 27/32* (2006.01)
*H01L 51/50* (2006.01)
*H01L 51/52* (2006.01)

(52) U.S. Cl.
CPC .......... *H01L 27/3232* (2013.01); *H01L 27/322* (2013.01); *H01L 27/3209* (2013.01); *H01L 51/5016* (2013.01); *H01L 51/5268* (2013.01); H01L 2251/5338 (2013.01)

(58) Field of Classification Search
CPC .......................... G09G 3/3233; H01L 27/3211
USPC ................... 313/504, 498, 506, 511
See application file for complete search history.

(56) References Cited

U.S. PATENT DOCUMENTS 7,745,986 B2    6/2010  Ito et al.
2011/0170290 A1 *  7/2011  Hikmet et al. ................ 362/235

FOREIGN PATENT DOCUMENTS

CN    1612654    *    5/2005

* cited by examiner

*Primary Examiner* — Vip Patel
(74) *Attorney, Agent, or Firm* — Duane Morris LLP

(57) ABSTRACT

A device is provided with a first OLED having a peak wavelength in the range 500-600 nm and a second OLED having a peak wavelength in the range 400-500 nm. Less than 2% of the light emitted by the first OLED has a wavelength of 650 nm or longer and less than 2% of the light emitted by the second OLED has a wavelength of 650 nm or longer.

20 Claims, 11 Drawing Sheets

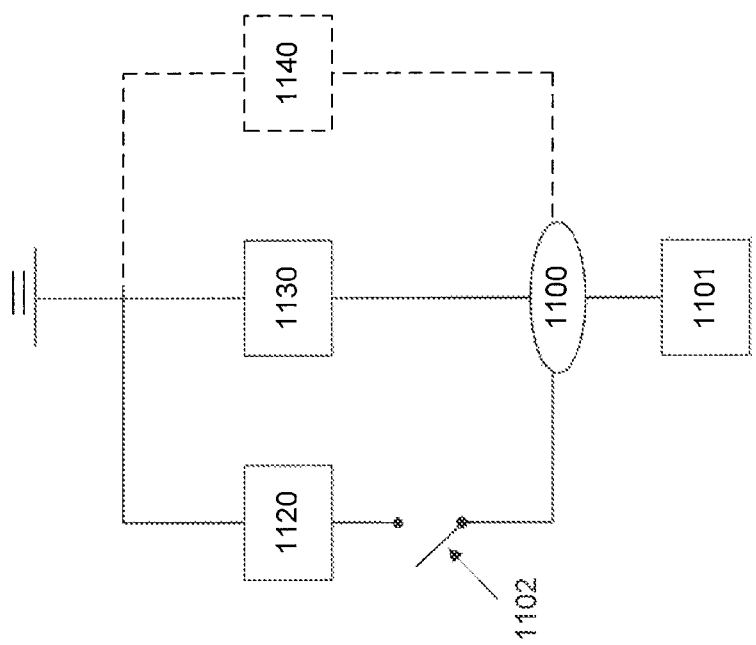

OLEDS FOR USE IN NVIS CAPABLE DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to OLEDs for use in NVIS (Night Vision Imaging System) capable devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

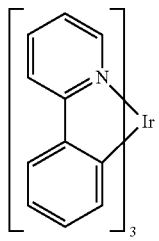

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704 which is incorporated herein by reference in its entirety.

SUMMARY OF THE INVENTION

In one embodiment, a device is provided comprising a first OLED having a peak wavelength in the range 500-600 nm and a second OLED having a peak wavelength in the range 400-500 nm. Less than 2% of the light emitted by the first OLED has a wavelength of 650 nm or longer and less than 2% of the light emitted by the second OLED has a wavelength of 650 nm or longer. Every OLED in the device has a peak wavelength less than 600 nm.

In one embodiment, less than 1% of the light emitted by the first OLED has a wavelength of 650 nm or longer and less than 1% of the light emitted by the second OLED has a wavelength of 650 nm or longer In one embodiment, less than 0.5% of the light emitted by the first OLED has a wavelength of 650 nm or longer and less than 0.5% of the light emitted by the second OLED has a wavelength of 650 nm or longer.

In one embodiment, less than 0.1% of the light emitted by the first OLED has a wavelength of 650 nm or longer and less than 0.1% of the light emitted by the second OLED has a wavelength of 650 nm or longer.

In one embodiment, the device is a display with a backlight and a liquid crystal layer. The backlight comprises at least one first OLED and at least one second OLED. The liquid crystal layer comprises a plurality of independently addressable liquid crystal elements positioned to block or pass light from the backlight. In one embodiment, the device further includes a diffuser positioned between the backlight and the liquid crystal layer. In one embodiment, the device further comprises at least one color filter.

In one embodiment, the device is a display with a plurality of independently addressable first OLEDs and a plurality of independently addressable second OLEDs.

In one embodiment, the first OLED comprises a microcavity. In one embodiment, the device comprises a red blocking filter disposed to filter red light from the light output of the first OLED).

In one embodiment, the second OLED comprises a microcavity. In one embodiment, the device comprises a red blocking filter disposed to filter red light from the light output of the second OLED.

In one embodiment, the device is capable of outputting light with 1976 CIE coordinates [u', v'] located within a 0.04 radius of CIE coordinates [0.190, 0.49].

In one embodiment, the device is flexible.

In one embodiment, the first OLED is positioned to emit light through the second OLED and the second OLED is transparent to light emitted by the first OLED. In one embodiment, the second OLED is positioned to emit light through the first OLED and the first OLED is transparent to light emitted by the second OLED.

In one embodiment, least one of the first OLED or one of the second OLED includes a phosphorescent emitting material. In one embodiment, the first OLED includes a phosphorescent emitting material. In one embodiment, the first OLED with the phosphorescent emitting material is positioned to emit light through the second OLED and the second OLED is transparent to light emitted by the first OLED including a phosphorescent material.

In one embodiment, white light comprising 60% light from the first OLED and 40% light from the second OLED has less than 1% light emitted with a wavelength of 650 nm or longer.

In one embodiment, a device is provided comprising a first OLED having a peak wavelength in the range 500-600 nm, a second OLED having a peak wavelength in the range 400-500 nm, and a third OLED having a peak wavelength in the range 600-700 nm. Less than 2% of the light emitted by the first OLED has a wavelength of 650 nm or longer and less than 2% of the light emitted by the second OLED has a wavelength of 650 nm or longer. The device is adapted to operate in a first mode and a second mode. In the first mode, the first, second, and third OLED are active. In the second mode, the first and second OLED are active and the third OLED is inactive.

In one embodiment, less than 1% of the light emitted by the first OLED has a wavelength of 650 nm or longer and less than 1% of the light emitted by the second OLED has a wavelength of 650 nm or longer In one embodiment, less than 0.5% of the light emitted by the first OLED has a wavelength of 650 nm or longer and less than 0.5% of the light emitted by the second OLED has a wavelength of 650 nm or longer.

In one embodiment, less than 0.1% of the light emitted by the first OLED has a wavelength of 650 nm or longer and less than 0.1% of the light emitted by the second OLED has a wavelength of 650 nm or longer.

In one embodiment, the device is a display with a backlight and a liquid crystal layer. The backlight comprises at least one first OLED, at least one second OLED, and at least one third OLED. The liquid crystal layer comprises a plurality of independently addressable liquid crystal elements positioned to block or pass light from the backlight. In one embodiment, the device is a display comprising a plurality independently addressable first OLEDS, a plurality of independently addressable second OLEDs, and a plurality of independently addressable third OLEDs.

In one embodiment, the device comprises an electronics signal processor wherein in the second mode, the electronics signal processor transforms a three matrix red-green-blue input signal into a two matrix green-blue output signal. In one embodiment, at least one of the first OLED, one of the second OLED, or one of the third OLED is transparent.

In one embodiment, the first OLED comprises a microcavity. In one embodiment, the device comprises a red blocking filter disposed to filter red light from the light output of the first OLED.

In one embodiment, the second OLED comprises a microcavity. In one embodiment, the device comprises a red blocking filter disposed to filter red light from the light output of the second OLED.

In one embodiment, at least one least one of the first OLED or one of the second OLED includes a phosphorescent emitting material. In one embodiment, the first OLED includes a phosphorescent emitting material.

BRIEF DESCRIPTION OF THE DRAWINGS

The accompany drawings, incorporated herein and forming part of the specification, illustrate embodiments of the present invention. Together with the description, the drawings further serve to explain the principles of the invention and to enable a person skilled in the pertinent art to make and use the invention.

FIG. 11 illustrates a circuit diagram of electronics signal processor's function according to one embodiment.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-II") and Baldo et al., "Very high-efficiency green organic light-emitting devices based on electrophosphorescence," Appl. Phys. Lett., vol. 75, No. 3, 4-6 (1999) ("Baldo-I"), which are incorporated by reference in their entireties. Phosphorescence is described in more detail in U.S. Pat. No. 7,279,704 at cols, 5-6, which are incorporated by reference.

Figure 1:
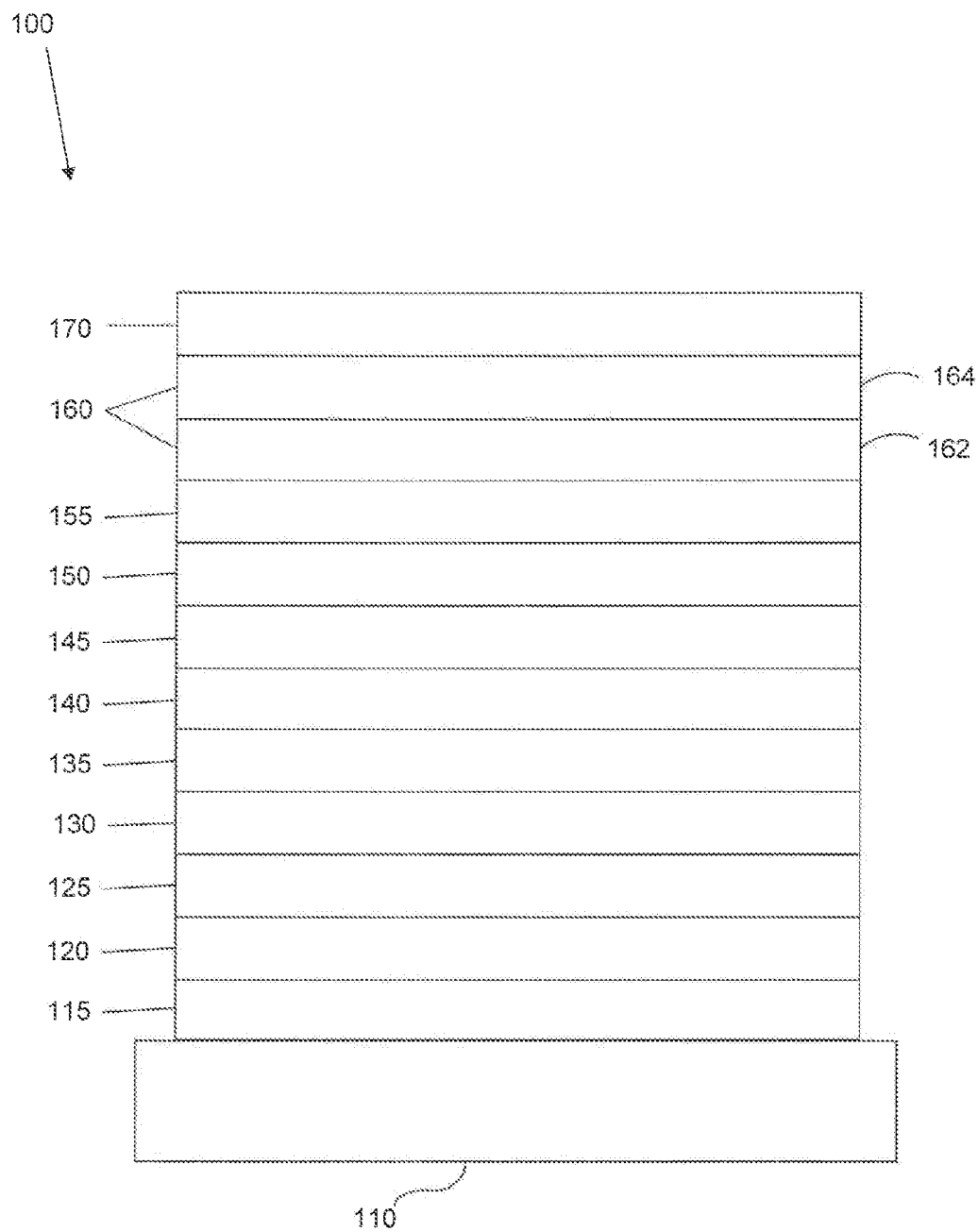
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols, 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
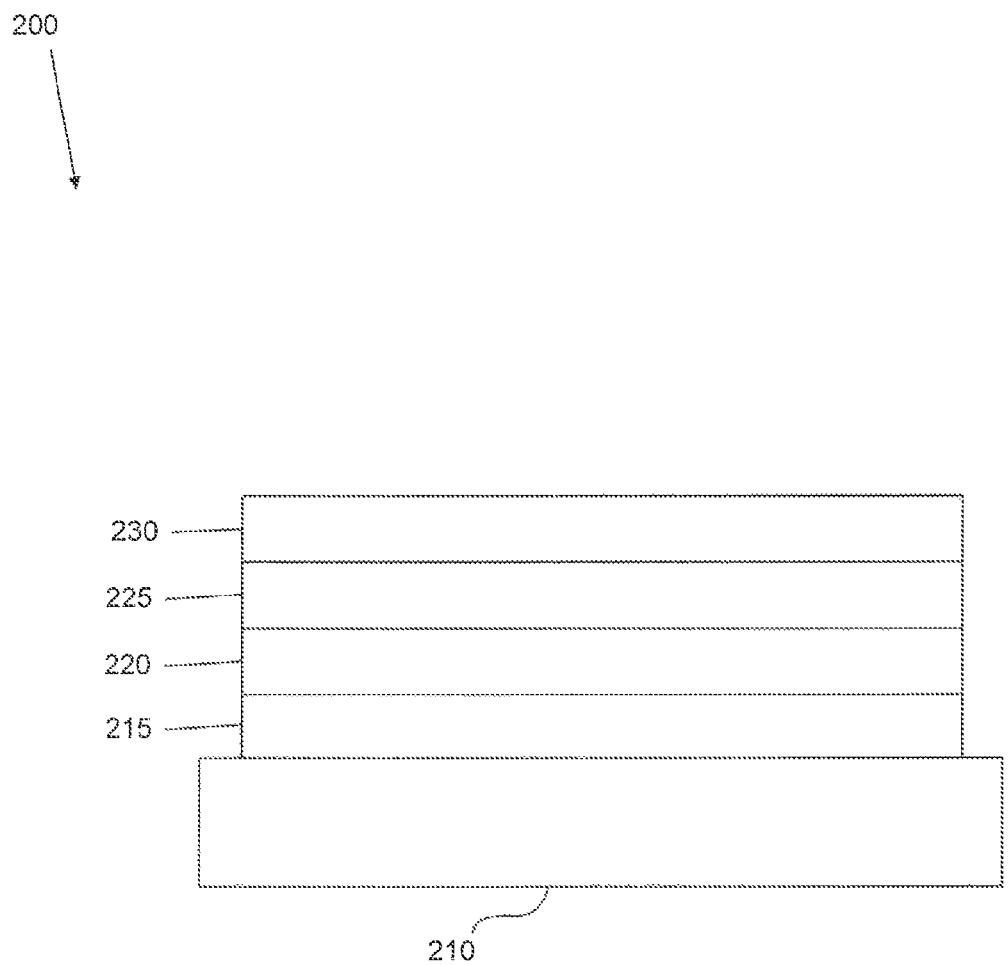
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols, 31-32, which are incorporated herein by reference.

As used herein, a "red OLED" has emission with a peak wavelength in the range of 600-700 nm. As used herein, a "green OLED" has emission with a peak wavelength in the range of 500-600 nm. As used herein, a "blue OLED" has emission with a peak wavelength in the range of 400-500 nm.

In this application, we disclose ways of using OLED technology to make NVIS (Night Vision Imaging System) capable devices. These devices are frequently used in the military. They generally have two modes: (1) a daylight mode with conventional RGB lighting, and (2) a NVIS mode where the display only produces low level "white light", without an IR component and very little red. The second mode describes the NVIS white spectrum.

Current military NVIS devices are LCDs utilizing LED backlights to create the NVIS spectra. Commercial off the shelf products in the LCD market will become less viable in the future due to their thin design approaches. This design approach cuts off many capabilities of creating a dual mode lighting system for rugged cockpit displays. Many designers tend to run into size constraints, issues of uniformity with LEDs, and backlight bleeding. Thus, it is difficult to obtain good thin dual mode lighting from LEDs alone.

Embodiments disclosed herein relate to active matrix OLED (AMOLED) displays as well as LCD displays using OLED backlights. Both types of displays use OLED technology and are suitable for NVIS application. Both types may be suitable only in NVIS uses where little or no red color is emitted. Both types of displays may also optionally have two modes, a first mode being a daytime mode and a second mode being the NVIS mode, and the ability to switch between the first and second modes. In the daytime mode, the device displays a regular red-green-blue spectrum. In NVIS mode, little or no red color is emitted. This application relates both to ways to make NVIS compatible OLED backlights for LCD displays and fully addressable active matrix OLED displays.

The performance of these devices is much superior to prior art. They increase NVIS image quality, allowing for crisper and more precise images. This is important in NVIS mode, especially for military devices because many military operations are done under the cover of night. During these operations, accuracy is key to the success of the mission. The increased NVIS image quality of these devices can lead to more efficient military operations. These devices also allow for thinner dual mode backlights for LCD displays.

Figure 6:
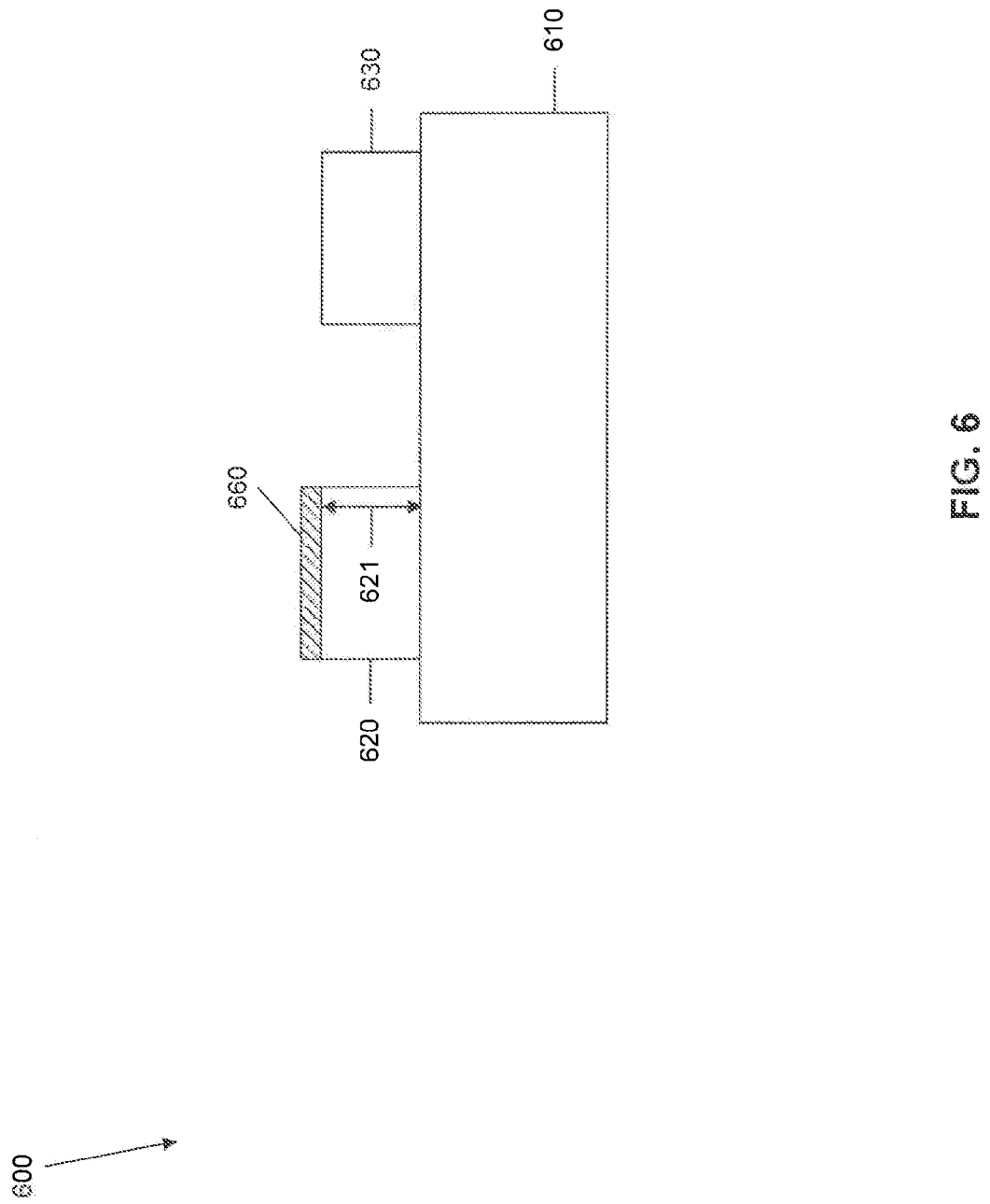
FIG. 6 shows an exemplary device with a first (green) OLED and a second (blue) OLED.
Figure 7:
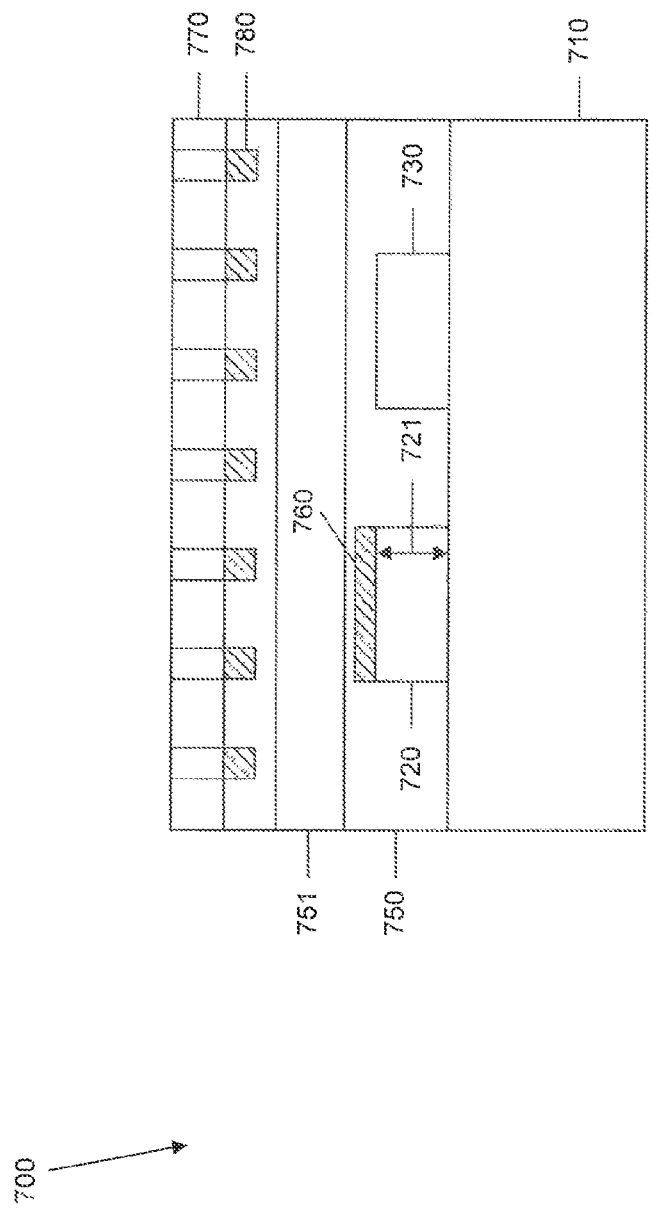
FIG. 7 shows an exemplary device with a backlight and a liquid crystal layer.
Figure 8:
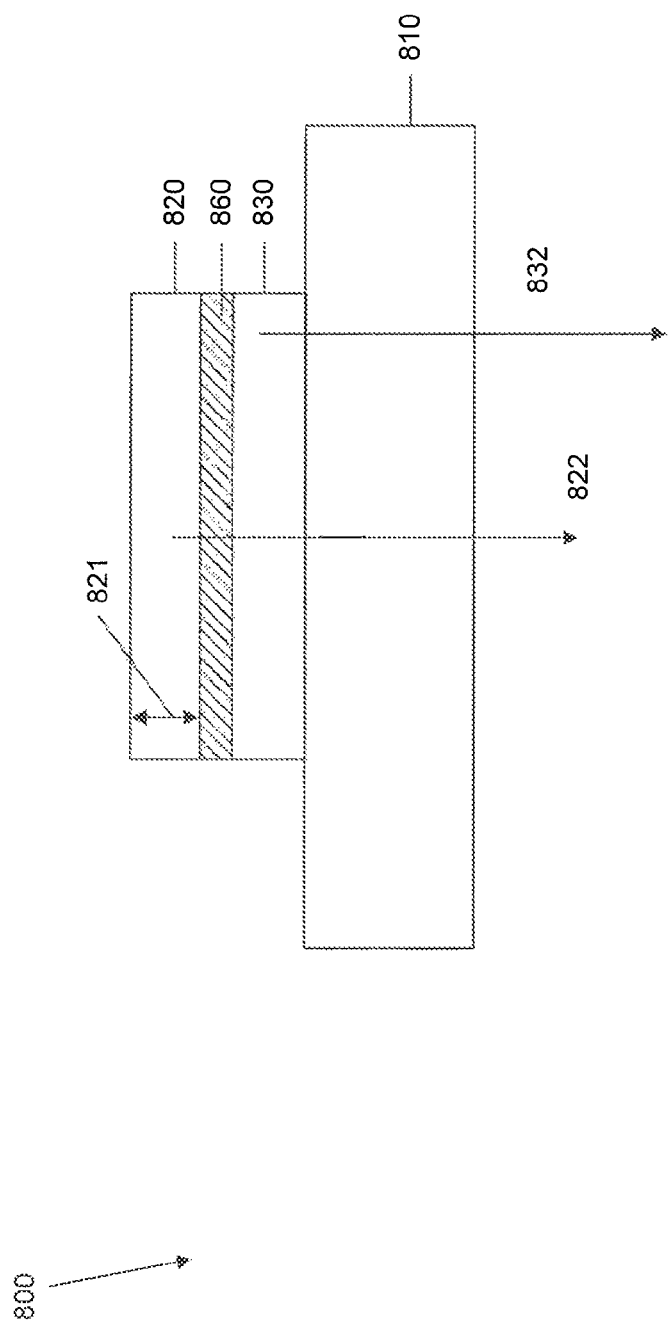
FIG. 8 shows an exemplary device with stacked first (green) and second (blue) OLEDs.

In some embodiments, such as those illustrated in FIGS. 6, 7, and 8, the NVIS capable display does not have pixels that emit red. In other embodiments, such as those illustrated in FIGS. 9, 10, and 11, the NVIS capable device includes pixels that emit red. However, these displays have a mode where the red pixels are inactive, regardless of the image signal being displayed.

Embodiments with No Red Pixel

The NVIS capable device can be made by combining at least one green OLED and at least one light blue OLED. FIG. 6 shows an exemplary device 600. Device 600 includes a substrate 610, and a first (green) OLED 620 and a second (blue) OLED 630 disposed over the substrate 610. As used herein, "a first OLED" and "a second OLED" includes a device having a plurality of first OLEDs and a plurality of second OLEDs. The first OLED 620 has a peak wavelength in the range of 500-600 nm and the second OLED 630 has a peak wavelength in the range of 400-500 nm. Every OLED in device 600 has a peak wavelength that is less than 600 nm. While peak wavelength is one way to measure an OLED, another way to measure an OLED is to use CIE coordinates of the OLED's light output. CIE coordinates can be measured according to a 1931 or 1976 standard and any given coordinate can be converted back and forth between the two standards. Thus, the first OLED 620 has light output with CIE coordinates of 1931 x, y=(0.451, 0.546) or 1976 u', v'=(0.209, 0.568) and the second OLED 630 has light output with CIE coordinates of 1931 x, y=(0.155, 0.243) or 1976 u', v'=(0.111, 0.390).

Additionally, device 600 is configured such that less than 2% of the light emitted by the first OLED 620 and less than 2% of the light emitted by the second OLED 630 has a wavelength of 650 nm or longer. Preferably it is less than 1%, and more preferably less than 0.5%. One way to quantify "light emitted" or "light output" is by the number of photons emitted per second by the OLED (or other emitting unit) across the visible spectrum. A spectrum of photons emitted per second may be normalized for convenient quantification. This type of quantification is used herein unless otherwise specified. The device 600 thus has a light output that is within the NVIS white target region in FIG. 3 with a minimal red color output.

Figure 3:
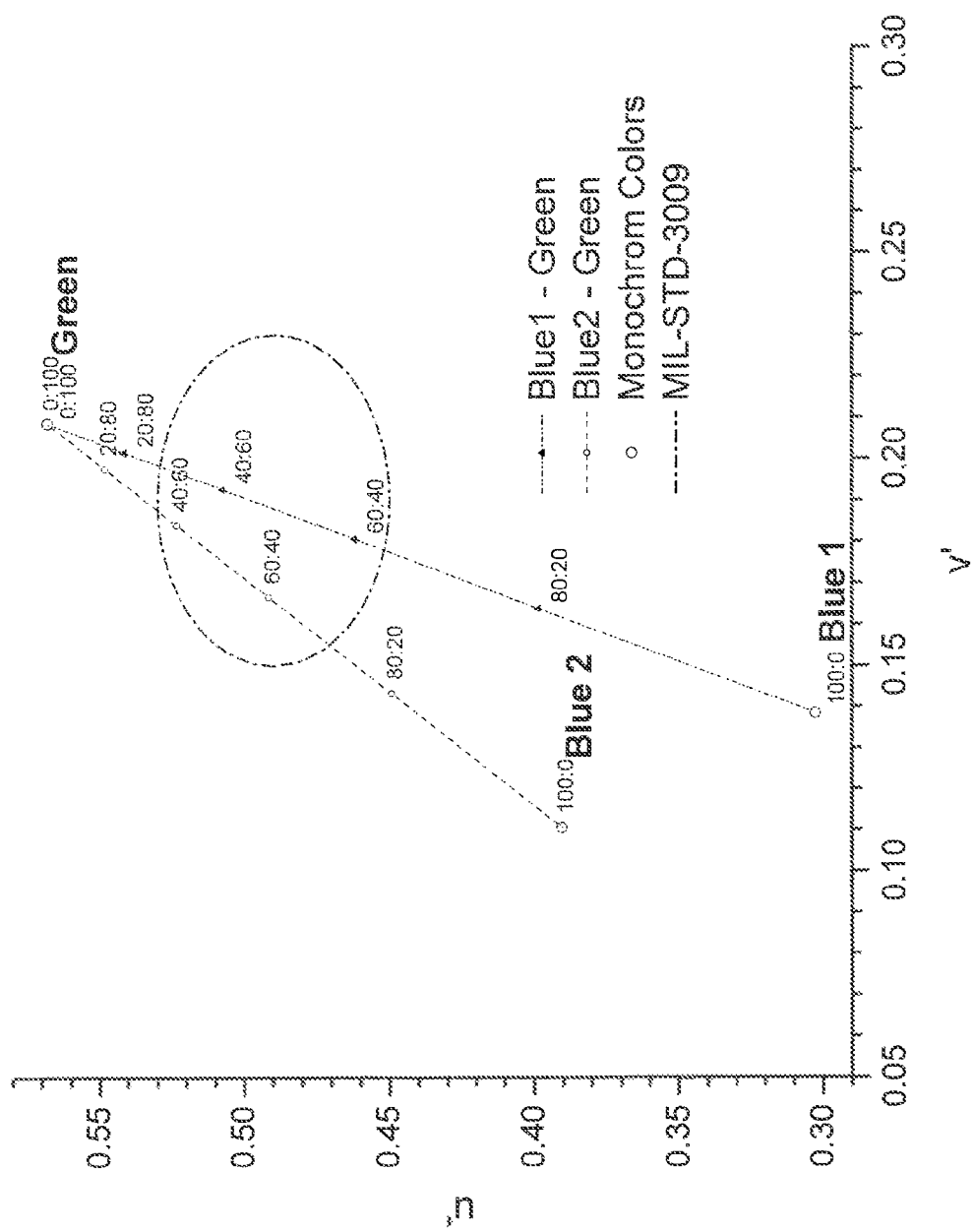
FIG. 3 shows an NVIS white target area on the 1976 CIE chart and an example of how to achieve it.

FIG. 3 shows the MIL-STD-3009 NVIS white target area. The MIL-STD-3009 specifies NVIS white target area as having coordinates [u', v'] located within a 0.04 radius of CIE coordinates [0.19, 0.49]. Mathematically, the MIL-STD-3009 criteria is met if the line between the CIE points of the blue and green OLEDs passes within 0.04 of [0.19, 0.49]. This can be expressed with the formula $((u'-0.19)^2+(v'-0.49)^2)^{1/2} \leq 0.04$, where u' and v' are the CIE coordinates of the point on the line between the CIE coordinates of the blue and green OLEDs closest to [0.19, 0.49]. A device with a first (green) and second (blue) OLED is capable of outputting light with CIE coordinates anywhere along the line between the CIE coordinates of the blue OLED and the green OLED, by adjusting the proportion of light emitted by each OLED. For some non-military applications, it may not be necessary to meet the strict criteria of MIL-STD-3009. Preferably, the line between the CIE coordinates of the blue OLED and the green OLED passes within 0.06 of [0.19, 0.49], and more preferably within 0.04.

When a device is used for NVIS application, the device user usually wears night-vision goggles to see the display. A red color output is undesirable during this time because the red color is intensified by the night-vision goggles. The intensified red degrades the image resolution that the user sees through the night-vision goggles and increases glare. Thus, an NVIS capable device should emit as little red color as possible while in NVIS mode. In device 600, one way to limit the red output is to limit the peak wavelengths emitted by every OLED to less than 600 nm. However, an OLED having a peak wavelength less than 600 nm can still emit red color. A standard green OLED has a light output spectrum with a long tail-end towards the red spectrum. To avoid the first (green) OLED having too much of a red component and further limit the red output of device 600, the first OLED can be made with a microcavity 621.

OLEDs may be constructed such that electrodes or other reflective or semi-reflective layers of the device define a microcavity. When the optical distance between two reflective or semi-reflective layers has a magnitude that is comparable to a wavelength of visible light, microcavity effects may result. The transmission of the separated layers may then exceed the transmission of the individual reflective or semi-reflective layers at one or more wavelengths or wavelength ranges. For example, a device may quench, prevent, or otherwise diminish emission at some wavelengths, and/or increase emission at certain wavelengths at which the device emits. While these and similar effects may be referred to as "microcavity effects," these devices are not necessarily considered to contain or define a "microcavity" as used herein. Such incidental microcavity effects typically are unintentional and undesirable.

A microcavity may be characterized by its finesse. The finesse F of a microcavity is defined as the ratio of the separation between resonant peaks in the transmission spectrum of the microcavity, $\Delta \upsilon$, to the full-width at half-maximum (FWHM) of the resonant frequency peak of the spectrum, $\Delta \upsilon_{1/2}$: $F = \Delta \upsilon / \Delta \upsilon_{1/2}$. As used herein, a "microcavity" or "cavity" is a stack of two or more layers having a finesse greater than about 1.5; the two outer layers of a microcavity may be referred to as "defining" a microcavity when the resulting microcavity has a finesse of at least about 1.5. Such a finesse corresponds to microcavity effects that are stronger than the incidental effects typically observed in, for example, an OLED. Incidental microcavity effects in an OLED generally have a finesse of less than 1.5, often less than 0.5. The resonant peaks in the transmission spectrum of a microcavity can be controlled by adjusting the reflectivity of the layers defining the microcavity and the separation between the layers. In general, microcavities may be constructed that have one transparent or semitransparent reflective layer and one opaque reflective layer. It may be preferred for reflective layers used in the microcavity devices described herein to have a reflectance of at least 20%, and more preferably 30-100%. In some cases, the "opaque" reflective layer may be opaque only with respect to certain wavelengths of visible light, while allowing other wavelengths to pass through the layer. In such a configuration, it may be preferred for the reflective layer to be at least 20% reflective, and more preferably 30-100% reflective, with respect to the desired wavelengths. The emission in the forward direction (i.e., through the transparent or semitransparent reflective layer) may be calculated as:

$$|E_n(\lambda)|^2 = \frac{(1-R_d)\left[1 + R_m + 2\sqrt{R_m}\cos\left(\frac{4\pi x}{\lambda}\right)\right]}{1 + \sqrt{R_m R_d}\cos\left(\frac{4\pi L}{\lambda}\right)}|E_n(\lambda)|^2 \quad \text{(Eq. 1)}$$

where $\lambda$ is the emission wavelength, x is the effective distance of the emissive layer from the opaque layer, $R_m$, and $R_d$ are the reflectivities of the opaque mirror and the transparent mirror, respectively, L is the total optical length of the microcavity, and $E_n(\lambda)$ is an original (free-space) spectrum. The optical length of the microcavity, L, may be given by:

$$L = \frac{\lambda}{2}\left(\frac{n_{eff}}{\Delta n}\right) + \sum_i n_i d_i + \left|\frac{\varphi_m}{4\pi}\lambda\right| \quad \text{(Eq. 2)}$$

where $n_{eff}$ and $\Delta n$ are the effective refractive index and the index difference between the reflective layers, $n_i$ and $d_i$ are the refractive index and the thickness of the organic layers and the transparent layer, and $\phi_m$ is the phase change at the opaque mirror. Thus, a microcavity may be used to enhance emission at certain wavelength, wavelengths, or range of wavelengths, while inhibiting emission at others. As used herein, the microcavity may be said to "leak" those wavelengths of light which are quenched, left unchanged, and/or only minimally enhanced by the microcavity. In general, the purpose of the microcavity here is to reduce the width of the OLED emission spectrum so as to reduce the emission of wavelengths that are much longer than the OLED peak emission wavelength.

A red-blocking filter 660 disposed over the first OLED 620 can also be used to reduce its red output. The filter may be any type of light filter known to the art that preferentially transmits green and/or blue light while blocking red light. Dichroic or interference filters are one example, and an absorptive dye is another example. While device 600 is shown having both a microcavity 621 and a filter 660, one can be used without the other. Additionally, neither can be used if the emission spectrum of the OLED already lacks red components. Because a standard blue OLED generally does not have a light emission spectrum with red components, neither a microcavity nor a red-blocking filter is needed for the second OLED. However, the device may include a red-blocking filter over the second OLED or a microcavity in the second OLED. Additionally, OLEDs 620 and 630 may have various sublayers not shown in FIG. 6 but are described herein elsewhere.

Device 600 can optionally be an active matrix device, where the first and second OLEDs are independently addressable from each other.

FIG. 7 shows an exemplary device 700. The device 700 includes a substrate 710, a backlight 750 disposed over the substrate, and a liquid crystal layer 770 disposed over the backlight. The backlight 750 comprises at least one first OLED 720 and at least one second OLED 730. OLEDs 720 and 730 are similar to OLEDs 620 and 630, respectively. Microcavity 721 and filter 760 of FIG. 7 are analogous to microcavity 621 and filter 660, respectively. The backlight can optionally be transparent. If it is transparent, a white lambertian sheet or enhanced specular reflector can be attached to the rear side of the backlight. This allows for the reflection of LED edgelit lighting without the color shifts. The backlight can also optionally be flexible. The backlight emits an NVIS white light that passes through the liquid crystal layer 770. The liquid crystal layer 770 is comprised of a plurality of independently addressable liquid crystal elements. It blocks or passes light emitted from the backlight 750 depending on the orientation of the liquid crystal elements. The device can also optionally include at least one color filter 780 or down conversion layer. This color filter or down conversion layer is preferably positioned between the liquid crystal layer and the backlight, but can also be disposed over the liquid crystal layer. The light passing through the liquid crystal layer or the color filter creates the image the device user sees. Device 700 optionally includes a diffuser 751. The diffuser 751 is positioned to diffuse light emitted from a plurality of the first OLEDs and a plurality of the second OLEDs. It is located between the backlight and the liquid crystal layer.

FIG. 8 shows an exemplary bottom-emitting device 800. Device 800 has a transparent substrate 810 with first OLED 820 and second OLED 830 disposed over the substrate. First OLED 820 and second OLED 830 are similar to OLEDs 620 and 630, respectively. Microcavity 821 and filter 860 of FIG. 8 are analogous to microcavity 621 and filter 660, respectively. Instead of placing the first and second OLEDs side by side as in FIGS. 6 & 7, however, the OLEDs here are stacked. The first OLED 820 is positioned to emit light 822 through the second OLED 830. As used herein, "through" means through direction that is on the way to the viewer. The second OLED 830 is transparent to light 822. Light 822 travels through the transparent second OLED 830, the transparent substrate 810, and out to the device user. OLED 830 emits light 832, which travels through the transparent substrate 810 out to the device user. Preferably, the first (green) OLED is phosphorescent, and the second (blue) OLED is fluorescent. Phosphorescent OLEDs are generally more preferred over fluorescent ones because they are more efficient. But, blue phosphorescent OLEDs often have lifetime and reliability issues so it might be preferred to use blue fluorescent OLEDs. However, either the first OLED 820, the second OLED 830, or both OLEDs can be phosphorescent. While FIG. 8 shows a bottom-emitting device, the order of the first and second OLEDs can be reversed for a top-emitting device. The preferred stacked configuration is when the first OLED emits light through the second OLED because the green absorption spectrum overlaps with the blue emission spectrum. If the second OLED is positioned to emit light through the first OLED, that light may be absorbed by the first OLED. In one embodiment, however, the second OLED is positioned to emit light through the first OLED and the first OLED is transparent.

FIG. 8 illustrates a "first" OLED (green emitting material) stacked with a "second" OLED (blue emitting material), The first and second OLEDs are illustrated and described as separate OLEDs, each with their own anode and cathode. In a different embodiment, blue and green emissive materials may be disposed between the same pair of electrodes.

While some concepts are described herein with respect to embodiments having only green and blue pixels, one of skilled in the art can understand that these concepts can also be applied to embodiments with red, green, and blue pixels where the red can be disabled.

Figure 9:
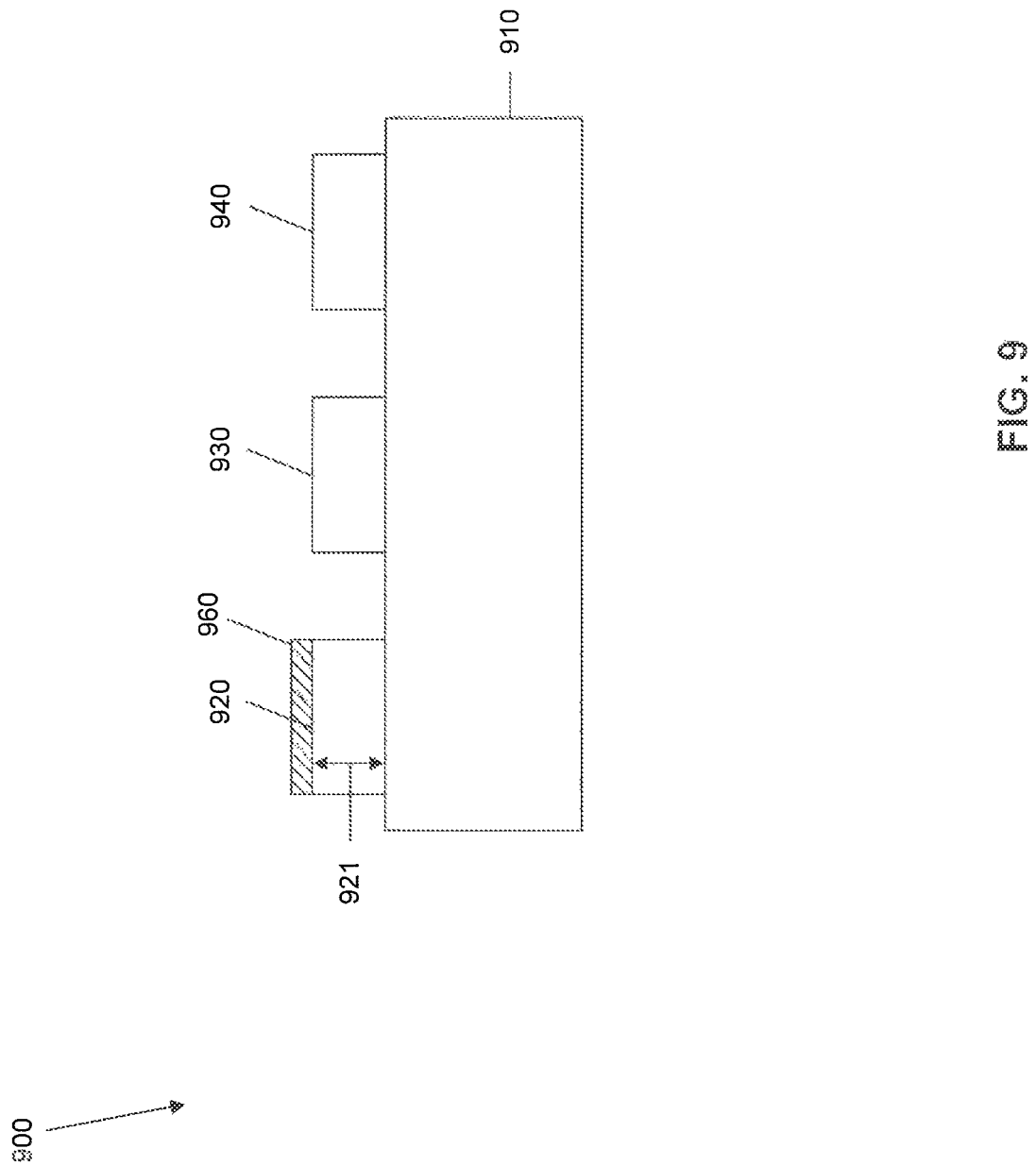
FIG. 9 shows an exemplary device with a first (green) OLED, a second (blue) OLED, and a third (red) OLED.

Embodiments with Red, Green, and Blue Pixels, where the Red Pixel can be Disabled FIG. 9 shows an exemplary device 900. Device 900 has substrate 910. A first OLED 920 and a second OLED 930 are disposed over substrate 910. OLEDs 930 and 920 are similar to OLEDs 630 and 620 respectively. Microcavity 921 and filter 960 of FIG. 9 are analogous to microcavity 621 and filter 660, respectively. Device 900, however, has an additional third (red) OLED 940 disposed over substrate 910 with a peak wavelength in the range 600-700 nm. As used herein, "a third OLED" includes a device comprising a plurality of third OLEDs. OLED 940 may have various sublayers not shown in FIG. 9 but are described herein elsewhere.

Device 900 is different to device 600 because every OLED in device 900 does not have a peak wavelength less than 600 nm. It is also different from device 600 in that it has two modes. In the first mode, all three OLEDs are active to produce a normal red-green-blue output for daylight use. In the second mode, only the first OLED 920 and the second OLED 930 are active. The third OLED 940 is inactive. As used herein, "inactive" means the OLED does not emit any light regardless of the image signal being displayed. The "inactive" status of the third OLED therefore is not image dependent. This second mode provides an NVIS spectrum for NVIS use. As in FIG. 8, either the first or second OLED may be transparent. Additionally, in device 900, the third OLED may also be transparent. Device 900 may be an active matrix device, where a plurality of the first OLED 920, a plurality of the second OLED 930, and a plurality of the third OLED 940 are each independently addressable with an integrated active matrix backplane. Device 900 may also be used by itself as an NVIS capable display, without needing a backlight or LCDs. In this configuration, it is preferable that the OLED pixels are independently addressable.

Figure 10:
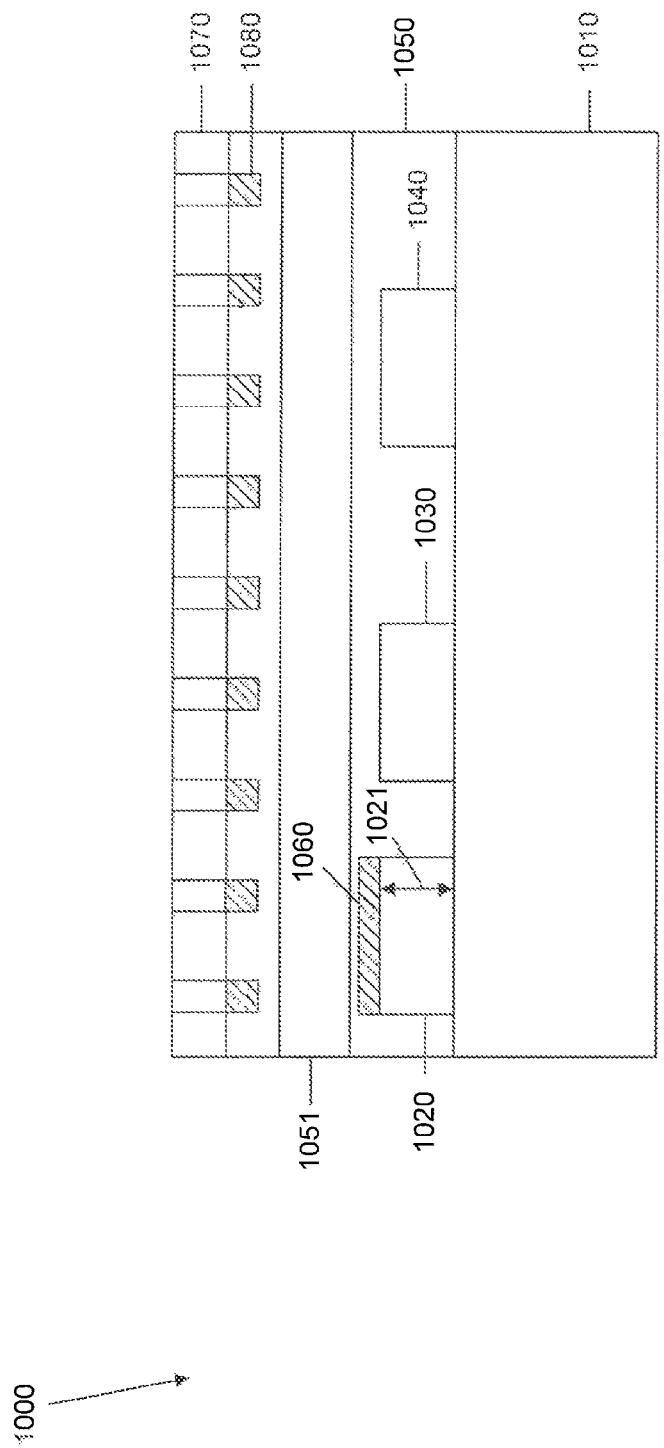
FIG. 10 shows an exemplary device with three different OLEDs, a diffuser, and a liquid crystal layer.

FIG. 10 shows an exemplary device 1000. Device 1000 has a substrate 1010, a backlight 1050 disposed over the substrate, and a liquid crystal layer 1070 disposed over the backlight. The backlight 1050 comprises at least one first OLED 1020, least one second OLED 1030, and at least one third OLED 1040. OLEDs 1020, 1030, and 1040 are similar to OLEDs 920, 930, and 940, respectively. Microcavity 1021 and filter 1060 of FIG. 10 are analogous to microcavity 621 and filter 660, respectively. The device 1000 also includes an optional diffuser 1051 positioned between the backlight 1050 and the liquid crystal layer to diffuse light emitted from the OLEDs. The liquid crystal layer 1070 is comprised of a plurality of independently addressable liquid crystal elements and is positioned to block or pass light emitted from the backlight. The device can also optionally include at least one color filter 1080 or a down conversion layer. Device 1000 also has the same two modes as device 900 and can be used in the daytime or in NVIS mode.

FIG. 11 is a diagram of the function of an electronics signal processor 1100. In one embodiment, this processor 1100 may be used to switch between the first and second modes of devices 900 and 1000. This embodiment is shown by the dotted lines in FIG. 11. In the first mode, the processor turns on switch 1102, such that the third OLED 1140 is active. In the first mode, all three OLEDs emit light according to the image signal received. In the second mode, the processor turns off switch 1102, such that the third OLED 1140 is inactive. The processor 1100 then processes the three matrix red-green-blue signal 1101 into a two matrix green-blue signal and relays it the first and second OLEDs. In the second mode, only the first OLED and the second OLED emit light. While an electronics signal processor is the preferred configuration to achieve the two modes, other configurations may be used. In another embodiment, this processor 1100 may be used with a device containing no third OLEDs 1140. In this embodiment, the connections represented by the dotted lines in FIG. 11 are not present.

Modeling

Figure 4:
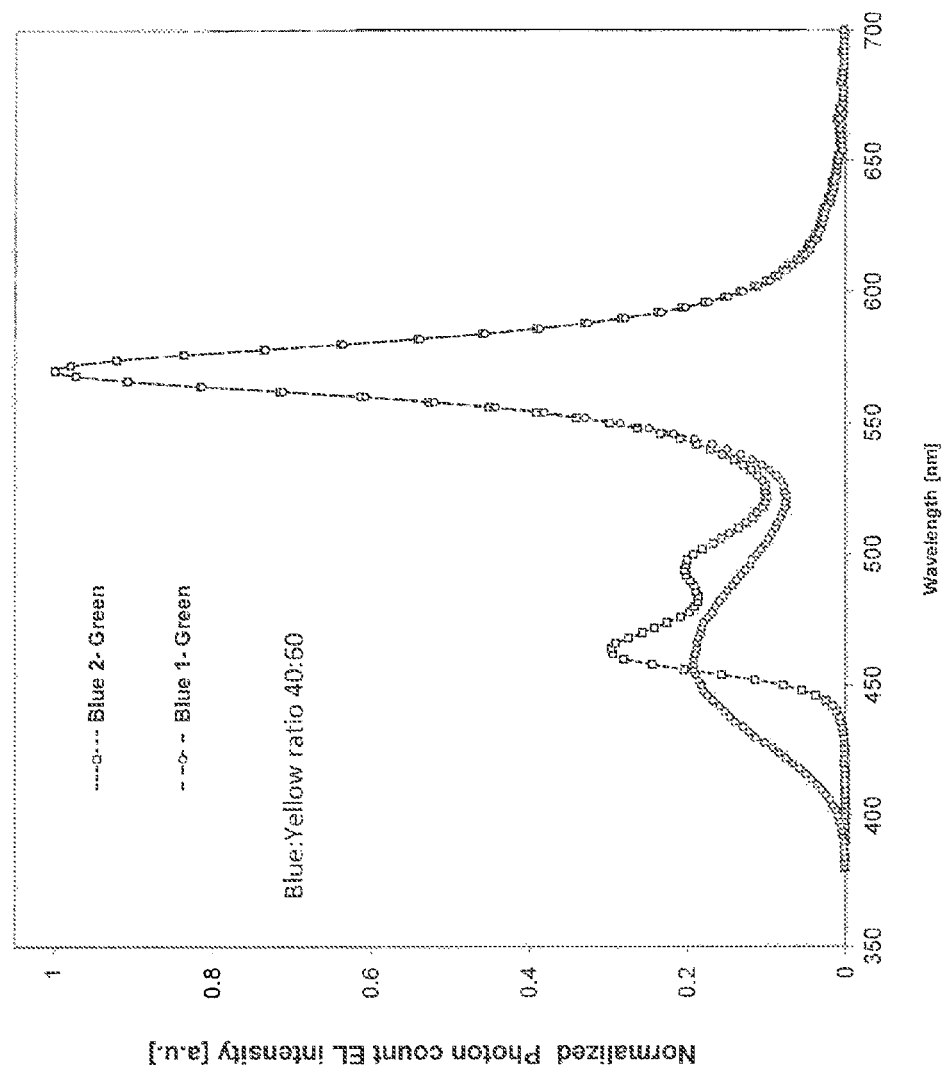
FIG. 4 shows examples of NVIS white electroluminance spectra.
Figure 5:
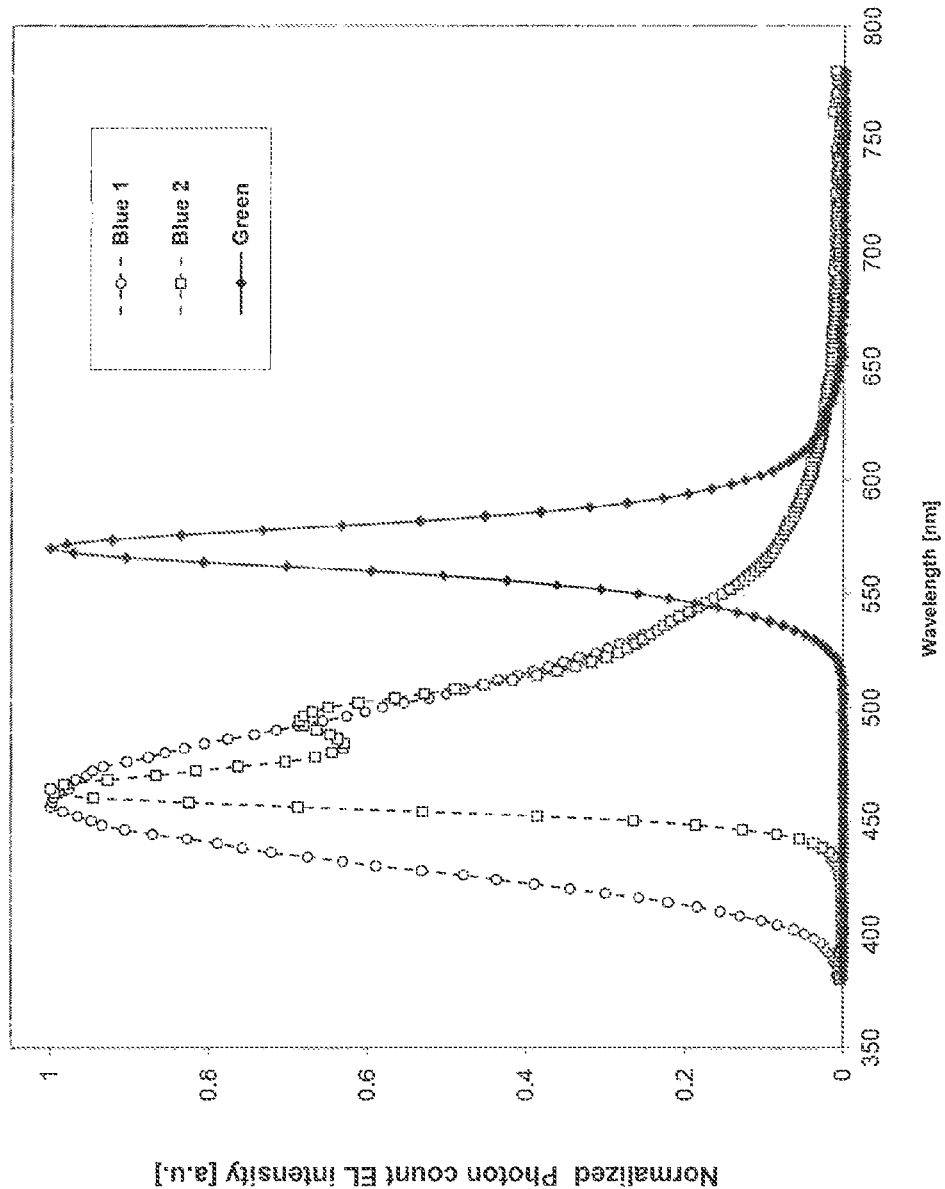
FIG. 5 shows the electroluminance spectra of monochrome PHOLEDs suitable for NVIS white generation.

As way of non-limiting example, FIG. 5 shows the electroluminance spectra of two phosphorescent blue OLEDs and one phosphorescent green OLEDs used to achieve the NVIS white spectrum of the disclosure. This is measured in photons emitted per second and normalized across the entire visible spectrum. The green OLED was run in combination with the blue1 OLED and then in combination with the blue2 OLED. While FIG. 5 characterizes all of OLEDs as phosphorescent, it is preferred that the green OLED is phosphorescent while the blue OLED is fluorescent. Phosphorescent OLEDs are generally more preferred over fluorescent ones because they are more efficient. But, blue phosphorescent OLEDs often have lifetime and reliability issues so it might be preferred to use blue fluorescent OLEDs. However, any or all of the OLEDs can be phosphorescent. Additionally, none of the OLEDs can be phosphorescent. FIG. 3 then shows the CIE coordinates with a light output of the green-blue1 combination and the green-blue2 combination when the OLEDs are run at different peak intensities. As FIG. 3 and Table 1 show, when either of the blue OLEDs at 40% normalized peak intensity is combined with the green OLED at 60% normalized peak intensity, the light output of the device falls into the NVIS white target region of the 1976 CIE chart. FIG. 4 shows the NVIS white electroluminance spectra of the resulting devices. This spectra is measured in photons per second. As is shown, the resulting spectra have a sharper roll off towards the red than the blue end of the spectrum. As FIG. 3 also shows, other blue-green peak intensity combinations, such as 60-40, also results in a light output in the NVIS white target spectra. Table 2 shows other properties, such as integrated radiance, integrated luminance, and photon radiation of the blue1, blue2, green OLEDS and their resulting combinations. One of skill in the art could readily further decrease the percentage of light having a wavelength 650 nm and greater by using microcavities and/or filters.

TABLE 1

Examples of NVIS white OLEDs: composition, ratio and CIE

| | | 1931 CIE | | 1976 CIE | |
|---|---|---|---|---|---|
| Example of White OLED | Blue:Green Ratio | x | y | u' | v' |
| Blue 1- Green | 40:60 | 0.344 | 0.403 | 0.193 | 0.508 |
| Blue 2- Green | 40:60 | 0.350 | 0.443 | 0.184 | 0.523 |

TABLE 2

Percentage of the emission in the spectral range above 650 nm relative to the whole visible spectrum (>650 nm [%])

| Structure | Integrated radiance [w/sr/m^2] | Integrated luminance [cd/m^2] | Photon radiation [Photons/s] |
|---|---|---|---|
| White Blue2-Green | 0.61 | 0.03 | 0.78 |
| White Blue1-Green | 0.56 | 0.02 | 0.73 |
| Blue 1 | 1.00 | 0.08 | 1.48 |
| Blue 2 | 1.12 | 0.08 | 1.59 |
| Green | 0.26 | 0.01 | 0.31 |

The invention claimed is:

1. A display device, comprising:
   a backlight comprising:
   at least one first OLED having an emission spectrum with a peak wavelength in the range 500-600 nm and less than 2% of the light emitted by the at least one first OLED has a wavelength of 650 nm or longer; and
   at least one second OLED having an emission spectrum with a peak wavelength in the range 400-500 nm and less than 2% of the light emitted by the at least one second OLED has a wavelength of 650 nm or longer, thus allowing the backlight to be suitable for a night vision imaging system.

2. The display device of claim 1, further comprising:
   a liquid crystal layer comprising a plurality of independently addressable liquid crystal elements positioned to block or pass light from the backlight.

3. The display device of claim 2, wherein the device further comprises a diffuser positioned between the backlight and the liquid crystal layer.

4. The display device of claim 1, wherein
the backlight is an active matrix device wherein the at least one first OLED and the at least one second OLED are independently addressable.

5. The display device of claim 2, further comprising at least one color filter.

6. The display device of claim 1, wherein each of the at least one first OLED comprises a microcavity for reducing red light emission from the at least one first OLED.

7. The display device of claim 1, further comprising a red blocking filter disposed over the at least one first OLED to reduce red light emission from the at least one first OLED.

8. The display device of claim 1, wherein each of the at least one second OLED comprises a microcavity for reducing red light emission from the at least one second OLED.

9. The display device of claim 1, further comprising a red blocking filter disposed over the at least one second OLED to reduce red light emission from the at least one second OLED.

10. The display device of claim 1, wherein the display device is capable of outputting light with 1976 CIE coordinates [u', v'] located within a 0.04 radius of CIE coordinates [0.19, 0.49].

11. The display device of claim 1, wherein the display device is flexible.

12. The display device of claim 1, wherein:
the at least one first OLED is positioned to emit light through the at least one second OLED; and
the at least one second OLED is transparent to light emitted by the at least one first OLED.

13. The display device of claim 1, wherein:
the at least one second OLED is positioned to emit light through the at least one first OLED; and
the at least one first OLED is transparent to light emitted by the at least one second OLED.

14. The display device of claim 1, wherein at least one of the at least one first OLED or at least one second OLED includes a phosphorescent emitting material.

15. The display device of claim 1, wherein the at least one first OLED includes a phosphorescent emitting material.

16. The display device of claim 15, wherein:
the at least one first OLED is positioned to emit light through the at least one second OLED; and
the at least one second OLED is transparent to light emitted by the at least one first OLED.

17. The display device of claim 1, wherein less than 1% of the light emitted by the at least one first OLED has a wavelength of 650 nm or longer and less than 1% of the light emitted by the at least one second OLED has a wavelength of 650 nm or longer.

18. The display device of claim 1, wherein less than 0.1% of the light emitted by the at least one first OLED has a wavelength of 650 nm or longer and less than 0.1% of the light emitted by the at least one second OLED has a wavelength of 650 nm or longer.

19. The display device of claim 1, wherein white light comprising 60% light from the at least one first OLED and 40% light from the at least one second OLED and has less than 1% light emitted with a wavelength of 650 nm or longer.

20. A display device, comprising:
a backlight comprising:
at least one first OLED having an emission spectrum with a peak wavelength in the range 500-600 nm, wherein less than 2% of the light emitted by the first OLED has a wavelength of 650 nm or longer;
at least one second OLED having an emission spectrum with a peak wavelength in the range 400-500 nm wherein less than 2% of the light emitted by the second OLED has a wavelength of 650 nm or longer; and
at least one third OLED having an emission spectrum with a peak wavelength in the range 600-700 nm;
wherein the display device is adapted to operate in a first mode and a second mode;
wherein in the first mode, the first, second, and third OLED are active; and the second mode is a night vision mode in which the first and second OLED are active and the third OLED is inactive.

* * * * *